(12) United States Patent  (10) Patent No.: US 8,810,002 B2
Jou et al.  (45) Date of Patent: Aug. 19, 2014

(54) VERTICAL METAL INSULATOR METAL CAPACITOR

(75) Inventors: Chewn-Pu Jou, Hsinchu (TW); Chen Ho-Hsiang, Hsinchu (TW); Fred Kuo, Hsinchu (TW); Tse-Hul Lu, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 327 days.

(21) Appl. No.: 12/825,605

(22) Filed: Jun. 29, 2010

(65) Prior Publication Data

US 2011/0108950 A1 May 12, 2011

Related U.S. Application Data

(60) Provisional application No. 61/259,787, filed on Nov. 10, 2009.

(51) Int. Cl.
*H01L 31/119* (2006.01)

(52) U.S. Cl.
USPC ............................................ 257/535; 361/303

(58) Field of Classification Search
USPC .................... 257/307, 308; 361/304.4, 301.4
See application file for complete search history.

(56) References Cited

U.S. PATENT DOCUMENTS

| | | | | |
|---|---|---|---|---|
| 5,245,505 A | * | 9/1993 | Shiga et al. | 361/311 |
| 5,583,359 A | * | 12/1996 | Ng et al. | 257/306 |
| 6,297,524 B1 | * | 10/2001 | Vathulya et al. | 257/303 |
| 6,329,234 B1 | | 12/2001 | Ma et al. | |
| 6,410,954 B1 | * | 6/2002 | Sowlati et al. | 257/306 |
| 6,441,419 B1 | | 8/2002 | Johnson et al. | |
| 6,524,940 B2 | * | 2/2003 | Verhaverbeke et al. | 438/600 |
| 6,570,210 B1 | * | 5/2003 | Sowlati et al. | 257/307 |
| 6,635,916 B2 | * | 10/2003 | Aton | 257/306 |
| 6,740,922 B2 | * | 5/2004 | Jones et al. | 257/303 |
| 6,743,671 B2 | * | 6/2004 | Hu et al. | 438/253 |
| 6,746,914 B2 | * | 6/2004 | Kai et al. | 438/253 |
| 6,822,312 B2 | * | 11/2004 | Sowlati et al. | 257/532 |
| 6,897,505 B2 | * | 5/2005 | Aton | 257/296 |
| 6,974,994 B1 | * | 12/2005 | Kuo et al. | 257/308 |
| 7,180,160 B2 | * | 2/2007 | Ferrant et al. | 257/618 |
| 7,187,015 B2 | | 3/2007 | Tsau | |
| 7,298,001 B1 | * | 11/2007 | Liu et al. | 257/306 |
| 7,348,624 B2 | * | 3/2008 | Sakaguchi et al. | 257/307 |

(Continued)

OTHER PUBLICATIONS

Wang, Chemical Vapor Deposition of Thin Films for ULSI Interconnect Metallization, Disertation, http://etd.Isu.edu/docs/available/etd-04042005-171306/unrestricted/Wang_dis.pdf, May 2005, 209 pages.*

(Continued)

*Primary Examiner* — Earl Taylor
(74) *Attorney, Agent, or Firm* — Lowe Hauptman & Ham, LLP

(57) ABSTRACT

A capacitor includes a first electrode. The first electrode includes a bottom conductive plane and a plurality of first vertical conductive structures. The bottom conductive plane is disposed over a substrate. The capacitor includes a second electrode. The second electrode includes a top conductive plane and a plurality of second vertical conductive structures. The capacitor includes an insulating structure between the first electrode and the second electrode. The first vertical conductive structures and the second vertical conductive structures are interlaced with each other thereby providing higher capacitance density.

19 Claims, 2 Drawing Sheets

(56) References Cited

U.S. PATENT DOCUMENTS

| | | | |
|---|---|---|---|
| 7,385,241 B2* | 6/2008 | Choi | 257/307 |
| 7,446,390 B2* | 11/2008 | Okuda et al. | 257/532 |
| 7,466,534 B2* | 12/2008 | Chinthakindi | 361/306.2 |
| 7,485,912 B2* | 2/2009 | Wang | 257/307 |
| 7,485,914 B2* | 2/2009 | Huang et al. | 257/309 |
| 7,518,850 B2* | 4/2009 | Kim et al. | 361/328 |
| 7,551,421 B2* | 6/2009 | Thompson et al. | 361/306.1 |
| 7,579,643 B2* | 8/2009 | Oh et al. | 257/306 |
| 7,635,887 B2* | 12/2009 | Steltenpohl | 257/306 |
| 7,643,268 B2* | 1/2010 | Chinthakindi | 361/306.2 |
| 7,662,695 B2* | 2/2010 | Choi | 438/396 |
| 7,663,175 B2* | 2/2010 | Komura et al. | 257/307 |
| 7,667,256 B2* | 2/2010 | Hommel et al. | 257/307 |
| 7,714,371 B2* | 5/2010 | Paul et al. | 257/306 |
| 7,741,670 B2* | 6/2010 | Pan | 257/306 |
| 7,768,054 B2* | 8/2010 | Benetik et al. | 257/303 |
| 7,768,055 B2* | 8/2010 | Chinthakindi et al. | 257/307 |
| 7,859,825 B2* | 12/2010 | Kim et al. | 361/328 |
| 7,863,662 B2* | 1/2011 | Sato et al. | 257/295 |
| 7,866,015 B2* | 1/2011 | Chinthakindi | 29/25.42 |
| 8,134,195 B2* | 3/2012 | Lee et al. | 257/304 |
| 8,138,539 B2* | 3/2012 | Barth et al. | 257/307 |
| 8,169,014 B2* | 5/2012 | Chen et al. | 257/307 |
| 8,207,567 B2* | 6/2012 | Chin et al. | 257/303 |
| 8,258,600 B2* | 9/2012 | Sugisaki et al. | 257/532 |
| 2002/0047154 A1* | 4/2002 | Sowlati et al. | 257/307 |
| 2003/0211731 A1* | 11/2003 | Kai et al. | 438/638 |
| 2004/0138050 A1* | 7/2004 | Wang et al. | 501/138 |
| 2004/0164339 A1* | 8/2004 | Felsner et al. | 257/307 |
| 2005/0133848 A1* | 6/2005 | Rotella | 257/307 |
| 2006/0086965 A1* | 4/2006 | Sakaguchi et al. | 257/307 |
| 2007/0071052 A1* | 3/2007 | Hommel et al. | 372/46.012 |
| 2008/0197399 A1* | 8/2008 | Hsu et al. | 257/307 |
| 2009/0141424 A1* | 6/2009 | Barth et al. | 361/311 |
| 2010/0012989 A1* | 1/2010 | Lee et al. | 257/288 |
| 2011/0108950 A1* | 5/2011 | Jou et al. | 257/532 |

OTHER PUBLICATIONS

OA dated Apr. 1, 2012 from corresponding application No. CN 201010546188.1.

* cited by examiner

VERTICAL METAL INSULATOR METAL CAPACITOR

CROSS-REFERENCE TO RELATED APPLICATIONS

The present application claims priority of U.S. Provisional Patent Application Ser. No. 61/259,787 filed on Nov. 10, 2009, which is incorporated herein by reference in its entirety.

TECHNICAL FIELD

The present disclosure relates generally to integrated circuits, and more particularly, to vertical metal-insulator-metal (MIM) capacitors.

BACKGROUND

Capacitors are widely used in integrated circuits. The capacitance of a capacitor is proportional to the capacitor area and the dielectric constant (k) of the insulation layer, and is inversely proportional to the thickness of the insulation layer. Therefore, to increase the capacitance, it is preferable to increase the area and k value and to reduce the thickness of the insulation layer.

A problem associated with the increased area is that a greater chip area is required. Conventional metal-insulator-metal (MIM) capacitors in integrated circuits have various horizontal comb structures. The horizontal structure capacitance correlates with inter-metal layer thickness. However, the thickness of an inter-metal layer is very difficult to control. This results in high variation of MIM capacitance in production for a target value. Accordingly, new methods and structures are desired for MIM capacitors.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Figure 1:
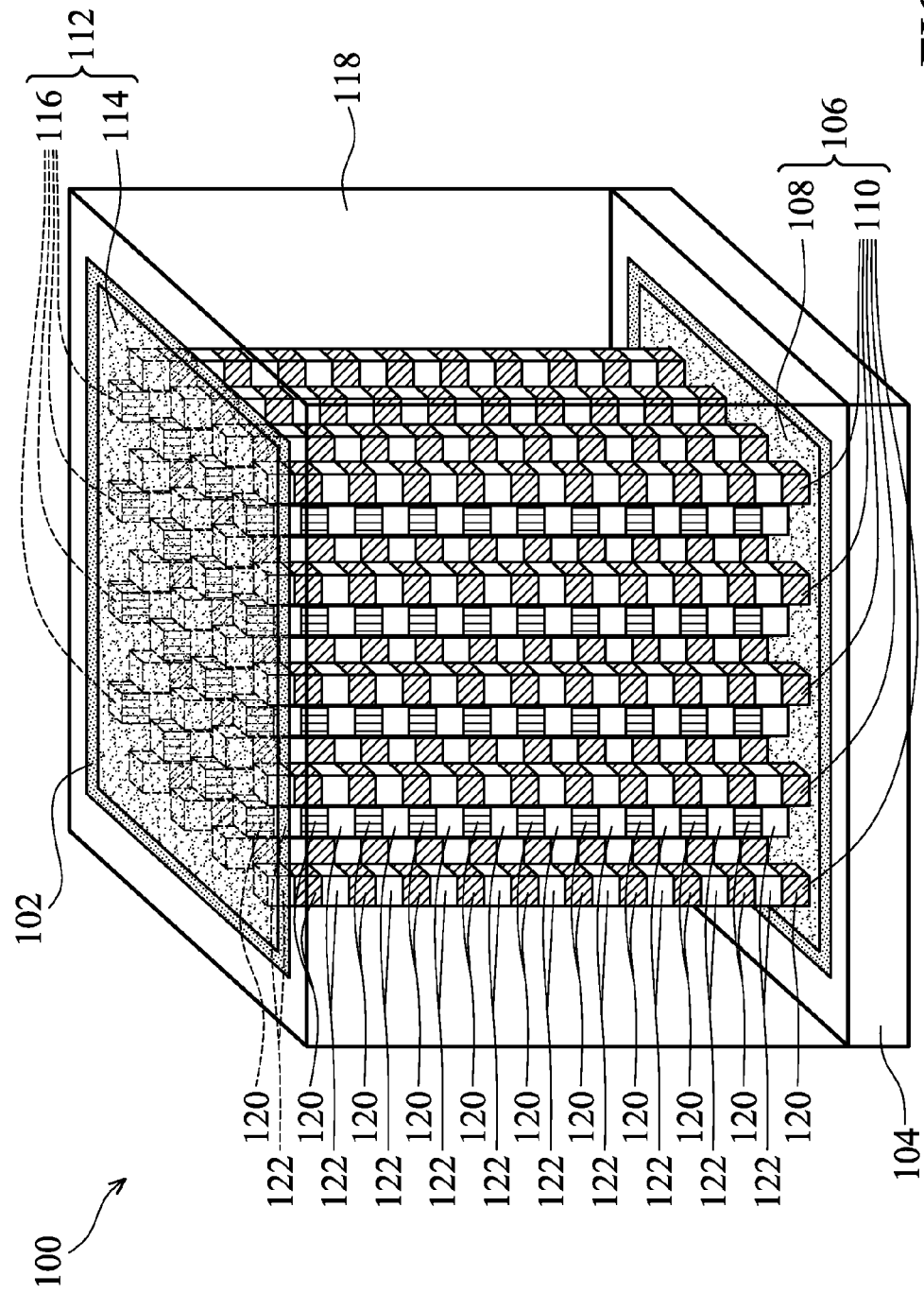
FIG. 1 illustrates a vertical capacitor in an integrated circuit in accordance with one or more embodiments.

A structure and a method for an integrated circuit capacitor are provided. FIG. 1 illustrates a vertical capacitor in an integrated circuit in accordance with one or more embodiments. In FIG. 1, a capacitor 102 is shown on a substrate 104 in an integrated circuit 100. The capacitor 102 includes a first electrode 106. The first electrode 106 includes a bottom conductive plane 108 and first vertical conductive structures 110. The bottom conductive plane 108 is disposed over the substrate 104. The capacitor 102 also includes a second electrode 112. The second electrode 112 includes a top conductive plane 114 and second vertical conductive structures 116. The capacitor 102 includes an insulating structure 118 between the first electrode 106 and the second electrode 112. The first vertical conductive structures 110 and the second vertical conductive structures 116 are interlaced with each other.

The integrated circuit 100 can include active devices such as transistors (not shown) and any other devices formed on the substrate 104. The integrated circuit 100 can include many metallization layers, for example M1 through Mx, where the M1 layer is the bottom metallization layer, and layer Mx can be the top metallization layer. The letter "x" represents an integer greater than one. The bottom conductive plane 108 and/or the top conductive plane 114 can be formed in a metallization layer commonly used for the formation of interconnect structures in integrated circuits. In one example, the capacitor 102 can extend from metallization layer M1 to metallization layer Mx. The bottom conductive plane 108 can be in the bottom metallization layer M1 and the top conductive plane 114 can be in the top metallization layer Mx. In this embodiment, since the capacitor 102 can be fabricated simultaneously with other features of the integrated circuit 100, the manufacturing cost is relatively low. However, it is appreciated that the bottom conductive plane 108 and the top conductive plane 114 of the capacitor 102 can be in any of the metallization layers or in any other suitable layers. Also, the bottom conductive plane 108 and the top conductive plane 114 can comprise any other suitable conductive material other than metal.

The first vertical conductive structures 110 can include more than one metal layer 122 connected by via layers 120. Each metal layer 122 is formed in a metallization layer commonly used for the formation of interconnect structures in integrated circuits. The metal layers 122 and via layers 120 alternate each other. The second vertical conductive structures 116 also include many metal layers 122 and via layers 120 alternating with each other.

Metal features, such as the metal layers 122, can comprise copper, copper alloys, or any other suitable material. The metal features may be formed using damascene processes. The damascene process which includes depositing a dielectric layer, etching the dielectric layer to form openings or trenches, filling the openings or trenches with metallic materials, and performing a chemical mechanical polish to remove excess material. The formation of the openings or trenches can involve ashing processes.

More particularly, a dual damascene process can be used. In a dual-damascene structure, only a single metal deposition step is used to simultaneously form main metal lines in the trenches and the metal in the vias. Thus, both the trenches and vias can be formed in a single dielectric layer. The vias and trenches can be defined by using two lithography steps. Trenches are typically etched to a depth of 4000-5000 Å, and the vias are typically 5000-7000 Å-deep. After the via and trench recesses are etched, the via is filled in the same metal-deposition step that fills the trench. After filling the vias and trenches, the excess metal deposited outside the trench is removed by a chemical mechanical planarization (CMP) process, and a planar structure with metal inlays is achieved.

The insulating structure 118 can include many inter-metal dielectric layers. In one embodiment, as the metal layers 122 and via layers 120 are formed, multiple inter-metal dielectric layers can be deposited and etched to form the insulating structure 118. In another embodiment, the k value of dielectric materials in the insulating structure 118 can be increased. In one example, a nitridation can be performed on the dielectric materials of the insulating structure 118 in the capacitor 102 to increase the dielectric constant k value of the dielectric materials. Accordingly, the k value of dielectric materials in the capacitor 102 can be greater than the k value of dielectric materials outside the capacitor 102. Outside the capacitor 102, the dielectric materials can have a low-k value, e.g. less than about 3.9, and even less than about 2.5 in other embodiments.

In another embodiment, the k value of dielectric materials in the capacitor 102 can be increased by the formation of OH terminations, which may be formed by treating the integrated circuit structure 100 in an $H_2O$ for example, moisture) containing environment. The treatment is preferably a plasma treatment or a thermal treatment. Alternatively, a silane treatment is performed. In yet another embodiment, the k value of dielectric materials in the capacitor 102 can be increased by implanting species such as nitrogen, carbon, oxygen, and the like. In various embodiments, the resulting k value of dielectric materials in the capacitor 102 can be increased to values greater than about 2.0.

In various embodiments, the first vertical conductive structures 110 and the second vertical conductive structures 116 can have a square shape, a rectangular shape, a circular shape, an oval shape, any other suitable shape in a cross section, or any combinations thereof. The first vertical conductive structures 110 can be distributed uniformly on the bottom conductive plane 108. The second vertical conductive structures 116 can be distributed uniformly under the top conductive plane 114. Also, the first vertical conductive structures 110 can be distributed in a square grid pattern on the bottom conductive plane 108. And the second vertical conductive structures 116 can be distributed in a square grid pattern under the top conductive plane 114.

Figure 2:
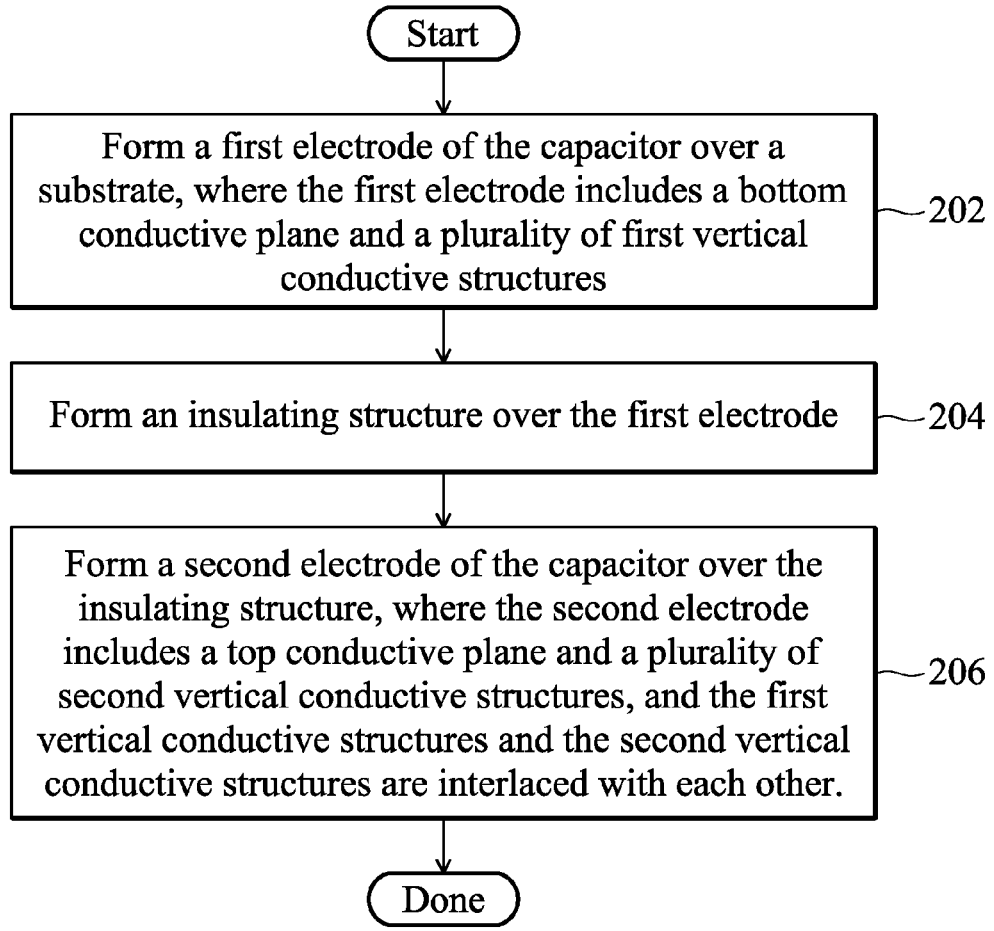
FIG. 2 illustrates an exemplary flow chart of a method for fabricating a vertical capacitor in an integrated circuit in accordance with one or more embodiments.

FIG. 2 illustrates an exemplary flow chart of a method for fabricating a capacitor in an integrated circuit in accordance with one or more embodiments. An exemplary method for forming a capacitor 102 includes forming the first electrode 106 of the capacitor 102 over the substrate 104 at the step 202 in FIG. 2. The first electrode 106 includes the bottom conductive plane 108 and the first vertical conductive structures 110 on the bottom conductive plane 108. At step 204, the insulating structure 118 is formed over the first electrode 106. At step 206, the second electrode 112 of the capacitor 102 is formed over the insulating structure 118. The second electrode 112 includes the top conductive plane 114 and the second vertical conductive structures 116 under the top conductive plane 114. The first vertical conductive structures 110 and the second vertical conductive structures 116 are interlaced with each other.

The step 202 of forming the first electrode 106 can include forming the bottom conductive plane 108 over the substrate 104. At least one first opening can be formed in a first dielectric layer of the insulating structure 118. A first metal layer can be deposited in the at least one first opening for forming at least a portion of the first vertical conductive structures 106. Further, a chemical mechanical planarization (CMP) process can be performed to the first metal layer.

The step 206 of forming the second electrode 112 can include forming at least one second opening in a second dielectric layer of the insulating structure 118. A second metal layer can be deposited in the at least one second opening for forming at least a portion of the second vertical conductive structures 116. The top conductive plane 114 can be formed over the second vertical conductive structures 116. Further, a CMP process can be performed to the second metal layer.

In addition, a third dielectric layer can be deposited between the first dielectric layer and the second dielectric layer. At least one third opening can be formed in the third dielectric layer. A third metal layer can be deposited in the at least one third opening for forming at least portions of both the first vertical conductive structures 110 and the second vertical conductive structures 116. Further, a CMP process can be performed to the third metal layer.

Different embodiments may have different advantages, including (1) higher capacitance density along the integrated circuit shrinkage trend, (2) less process variation due to better lithography process control compared to a layer thickness control for the conventional capacitor fabrication, (3) an easier interconnect routing for both of the electrodes 106 and 112 of the capacitor 102 compared to the complicated wiring for the conventional capacitors, and/or (4) easier adaptation to shrinking technology nodes, because horizontal dimensions shrink regularly across technology node generations, but vertical dimensions do not. The radio frequency modeling of the capacitor 102 can be also relatively simple for similar reasons. Even though this disclosure includes exemplary embodiments, a skilled person in the art will appreciate that there can be many embodiment variations of this disclosure.

Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A capacitor, comprising:
   a first electrode including a bottom conductive plane and a plurality of first vertical conductive structures, the bottom conductive plane being disposed over a substrate, wherein each first vertical conductive structure of the plurality of first vertical conductive structures comprises:
      a plurality of first metal layers, wherein each first metal layer of the plurality of first metal layers is connected to an adjacent first metal layer of the plurality of first metal layers by a via, and the via and the adjacent first metal layer comprise a continuous metal filling;
   a second electrode including a top conductive plane and a plurality of second vertical conductive structures; and
   an insulating structure between the first electrode and the second electrode, a portion of the insulating structure is positioned between the first vertical conductive structures and the second vertical conductive structures,
   wherein the plurality of first vertical conductive structures and the plurality of second vertical conductive structures are interlaced with each other and the insulating structure comprises another portion different from the portion between the first vertical conductive structures and the second vertical conductive structures, the portion between the first vertical conductive structures and the second vertical conductive structures comprising a material having a dielectric constant value greater than a dielectric constant value of the another portion of the insulating structure.

2. The capacitor of claim 1, wherein the plurality of second vertical conductive structures comprise a plurality of second metal layers and a plurality of second via layers alternating with each other.

3. The capacitor of claim 1, wherein the insulating structure includes a plurality of inter-metal dielectric layers.

4. The capacitor of claim 1, wherein the plurality of first vertical conductive structures are distributed uniformly on the bottom conductive plane, and the plurality of second vertical conductive structures are distributed uniformly under the top conductive plane.

5. The capacitor of claim 1, wherein the plurality of first vertical conductive structures are distributed in a square grid pattern on the bottom conductive plane, and the plurality of second vertical conductive structures are distributed in a square grid pattern under the top conductive plane.

6. An integrated circuit, comprising:
a substrate;
a dielectric layer on the substrate, the dielectric layer having a first dielectric constant value;
a plurality of metal layers;
a plurality of inter-metal dielectric layers; and
a capacitor comprising:
    a first electrode including a bottom conductive plane and a plurality of first vertical conductive structures, wherein the bottom conductive plane is disposed over the substrate and in a first metal layer of the plurality of metal layers;
    a second electrode including a top conductive plane and a plurality of second vertical conductive structures, wherein the top conductive plane is in a second metal layer of the plurality of metal layers, and the plurality of first vertical conductive structures and the plurality of second vertical conductive structures are interlaced with each other; and
    an insulating structure between the first vertical conductive structures and the second vertical conductive structures, wherein the insulating structure includes portions of the plurality of inter-metal dielectric layers, the plurality of first vertical conductive structures include first portions of the plurality of metal layers between the first metal layer and the second metal layer, and the plurality of second vertical conductive structures include second portions of the plurality of metal layers between the first metal layer and the second metal layer, and the insulating structure having a second dielectric constant value greater than the first dielectric constant value,
wherein the insulating structure is a portion of the dielectric layer, and the dielectric layer is outside the capacitor.

7. The integrated circuit of claim 6, wherein the plurality of first vertical conductive structures comprise the first portions of the plurality of metal layers and a plurality of first via layers alternating with each other, and the plurality of second vertical conductive structures comprise the second portions of the plurality of metal layers and a plurality of second via layers alternating with each other.

8. The integrated circuit of claim 6, wherein the plurality of first vertical conductive structures are distributed uniformly on the bottom conductive plane and the plurality of second vertical conductive structures are distributed uniformly under the top conductive plane.

9. The integrated circuit of claim 6, wherein the plurality of first vertical conductive structures are distributed in a square grid pattern on the bottom conductive plane, and the plurality of second vertical conductive structures are distributed in a square grid pattern under the top conductive plane.

10. A capacitor, comprising:
a first electrode including a bottom conductive plane and a plurality of first vertical conductive structures, the bottom conductive plane being disposed over a substrate, wherein each first vertical conductive structure of the plurality of first vertical conductive structures comprises:
    a plurality of first metal layers, wherein each first metal layer of the plurality of first metal layers is connected to an adjacent first metal layer of the plurality of first metal layers by a via, and the via and the adjacent first metal layer comprise a continuous metal filling;
a second electrode including a top conductive plane and a plurality of second vertical conductive structures; and
an insulating structure between the first electrode and the second electrode, the insulating structure comprising a dielectric material having a dielectric constant greater than 2 between the first vertical conductive structures and the second vertical conductive structures,
wherein the plurality of first vertical conductive structures and the plurality of second vertical conductive structures are interlaced with each other, and the insulating structure comprises another portion different from the portion between the first vertical conductive structures and the second vertical conductive structures, the another portion of the insulating material different from the portion between the first vertical conductive structures and the second vertical conductive structures comprising a material having a dielectric constant value less than the dielectric constant value of the portion of the insulating structure between the first vertical structures and the second vertical structures.

11. The capacitor of claim 10, wherein the plurality of second vertical conductive structures comprise a plurality of second metal layers and a plurality of second via layers alternating with each other.

12. The capacitor of claim 11, wherein each via of the first plurality of via layers has a height ranging from 5000 Angstroms to 7000 Angstroms and each via layer of the second plurality of via layers has a height ranging from 5000 Angstroms to 7000 Angstroms.

13. The capacitor of claim 10, wherein the insulating structure is a nitrogen-containing dielectric material.

14. The capacitor of claim 10, wherein the insulating structure is a hydroxide-containing dielectric material.

15. The capacitor of claim 10, wherein the plurality of first vertical conductive structures are distributed uniformly on the bottom conductive plane, and the plurality of second vertical conductive structures are distributed uniformly under the top conductive plane.

16. The capacitor of claim 10, wherein the plurality of first vertical conductive structures are distributed in a square grid pattern on the bottom conductive plane, and the plurality of second vertical conductive structures are distributed in a square grid pattern under the top conductive plane.

17. The capacitor of claim 10, wherein the plurality of first vertical conductive structures and the plurality of second vertical conductive structures comprise copper.

18. The capacitor of claim 1, wherein the via has a height ranging from 5000 Angstroms to 7000 Angstroms.

19. The capacitor of claim 1, wherein the insulating structure is a hydroxide-containing dielectric material.

* * * * *